(12) United States Patent
Pike

(10) Patent No.: US 6,288,411 B1
(45) Date of Patent: Sep. 11, 2001

(54) DEFECT COLLECTING STRUCTURES FOR PHOTOLITHOGRAPHY

(75) Inventor: Christopher Lee Pike, Fremont, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/397,292

(22) Filed: Sep. 15, 1999

(51) Int. Cl.[7] ..................................................... H01L 23/58
(52) U.S. Cl. ............................. 257/48; 257/620; 438/11; 438/12; 438/114; 438/115; 438/462; 438/465
(58) Field of Search ........................ 257/48, 620; 438/11, 438/12, 114, 115, 462, 465

(56) References Cited

U.S. PATENT DOCUMENTS 5,832,585 * 11/1998 Takiar et al. ............................ 29/424
5,849,642 * 12/1998 Koo et al. .............................. 438/745
6,174,632 * 1/2001 Pike ........................................ 430/30

* cited by examiner

Primary Examiner—Eddie Lee
Assistant Examiner—Matthew E. Warren
(74) Attorney, Agent, or Firm—Eschweiler & Associates, LLC

(57) ABSTRACT

A method and apparatus for collecting defect includes forming a defect collecting structure on a wafer such that any residue defects tend to settle on the defect collecting structure instead of the circuit patterns. The defect collecting structure can be located within the die or on the scribelines between the dies. When the defect collecting structure is located in a die, it should have dimensions significantly larger than the dimensions of the surrounding circuits patterns.

The defect collecting structure can include a plurality of defect collecting structures. The defect collecting structures can be contiguous or non-contiguous. The defect collecting structure(s) can occupy one hundredth of one percent of the die or more.

The defect collecting structures can be created on a wafer by coating, exposing, developing, and optionally, detecting defects. The wafer is exposed with a mask that includes a pattern for the defect collecting structure(s).

13 Claims, 3 Drawing Sheets

DEFECT COLLECTING STRUCTURES FOR PHOTOLITHOGRAPHY

FIELD OF THE INVENTION

The present invention relates generally to manufacturing wafers with structures that collect manufacturing defects. More specifically, it relates to using portions of the wafer to attract particles that cause defects.

BACKGROUND OF THE INVENTION

During wafer fabrication of solid-state devices, photomasks, and reticles are used to form patterns for each layer of the devices on a semiconductor wafer. Even an extremely small defect created during this process can greatly affect the production yield, circuit reliability, or circuit functionality. Wafers are commonly inspected during each step of the fabrication process to detect such defects. Defects may be correctable requiring additional time and expense before the fabrication process continues. Other defects may require scrapping the entire wafer.

Defects can occur in the resist development process. When resist is exposed, a chemical reaction occurs, which results in the production of various chemical by-products. Some of these by-products are not readily soluble in the developing solution, producing a residue that adheres to the wafer surface. Thus, the residue can be difficult to remove and creates defects. Such by-products tend to adhere to areas of the wafer with either relatively fewer patterns or to areas with large simply geometric patterns. Photolithography resist residue causes such defects and tends to adhere to such areas.

Residue defects adhering to the substrate in a large developed area can interfere with subsequent fabrication steps including the etch and implantation processes. Such interference can affect the performance or operation of the device produced by the process. The residue defect can act as a partial mask causing incomplete etching of the underlying film. This leads to a defect that is subsequently covered by the film when the next layer is applied during the manufacturing process. If this film is non-opaque, the defect will be detected during subsequent defect inspections since the defect can be detected through optically transparent films. The residue defect adds to the resist thickness but still prevents etching or implantation locally. Once the etch or implantation process is complete, the defect is removed with the rest of the resist. Thus, a residue defect that adheres to a resist structure will prevent a decrease in the signal-to-noise ratio at subsequent defect inspections, relative to a residue defect that adheres to the substrate.

When the residue defect adheres to the a resist structure, it is less likely to interfere with subsequent etch or implantation processes. However, such a defect will decrease the signal-to-noise ratio for the defect inspection at the photolithography layer.

"Lithography" is a process of transferring a pattern or image from one medium to another, as from a mask to a wafer. Photolithography is a lithographic technique involving light as the pattern transfer medium.

A "mask" is a transparent, for example glass or quartz, plate covered with patterns used in making integrated circuits. Each pattern consists of opaque and transparent areas that define the size and shape of all circuit and device elements. The mask is used to expose selected areas of resist, which defines areas to be etched. The term "reticle" includes mask, especially a photomask, used in wafer fabrication.

A "photoresist" is a light-sensitive liquid that is spread as a uniform thin film on a wafer or substrate. After baking to solidify the liquid, exposure of specific patterns is performed using a photomask. Material remaining after development shields regions of the wafer from subsequent etch or implant operations.

BRIEF SUMMARY OF THE INVENTION

According to the present invention, a wafer includes a substrate and a plurality of identical dies formed on the substrate. Each die contains a first area and second area. The functional circuit pattern is in the first area and a defect collecting structure is in the second area. The defect collecting structure's surface area is at least four times larger than the circuit patterns near the defect collecting structure. The defect collecting structure can be functional or non-functional, regularly or irregularly shaped. The defect collecting structure can include a plurality of defect collecting structures, they can be contiguous structures or non-contiguous. The defect collecting structure(s) should occupy at least one hundredth of one percent (0.01%) of the die's surface area. Alternatively, the defect collecting structure(s) can occupy at least one tenth of one percent (0.1%) of the die's surface area or one percent (1.0%) of the die's surface area.

A standard wafer has a substrate and a plurality of dies formed on the substrate with scribelines separating the dies. A defect collecting structure can be located on a scribeline. The defect collecting structure attracts residue defects caused during die formation.

The method of manufacturing defect collecting structure on a wafer includes coating, exposing, developing, and optionally, detecting defects. First, the wafer is coated with a resist. Second, the wafer is exposed with a mask. The mask can include a plurality of die regions. Each die region can include a first area that includes a circuit pattern. The mask can include a second area covering at least 0.1% of the die or at least 0.01%. The defect collecting structure pattern is located in the second area. The first and second areas are non-overlapping. Third, the resist is developed. Optionally, monitored to detect defects on the wafer may be used.

BRIEF DESCRIPTION OF SEVERAL VIEWS OF THE DRAWINGS

The present invention is described with reference to the accompanying figures. In the figures, like reference numbers indicate identical or functionally similar elements. Additionally, the left-most digit(s) of a reference number identifies the figure in which the reference number first appears.

DETAILED DESCRIPTION OF THE INVENTION

Figure 1:
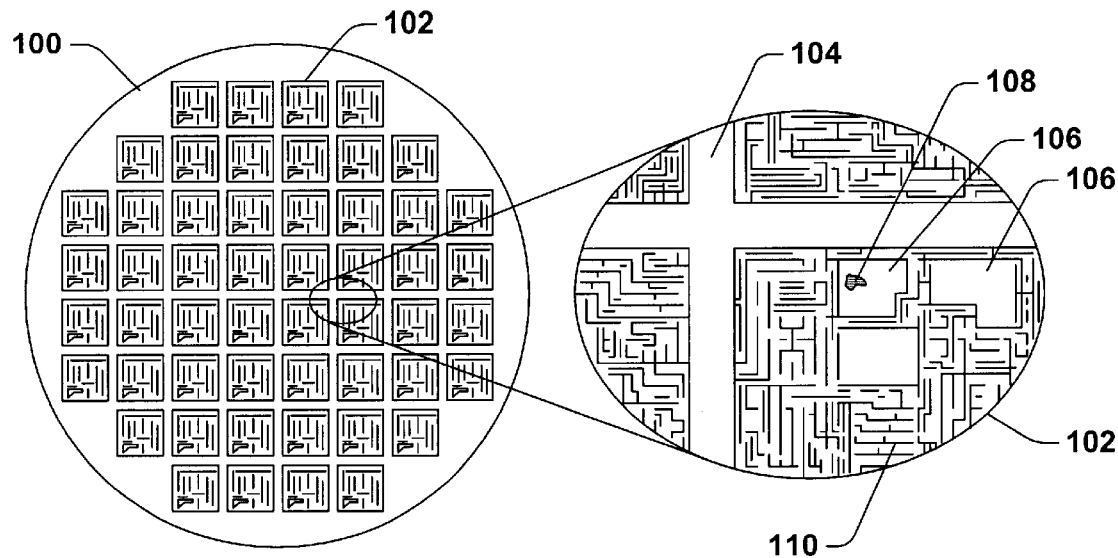
FIG. 1 is an illustration of a wafer with a plurality of dies and a close view of a section of the wafer with fully removed resist.

FIG. 1 shows a conventional wafer 100 with numerous dies 102. Each die 102 includes a circuit pattern 110. The circuit pattern 110 has a pattern dimension and performs functional tasks. The pattern dimension is the resolution level of the fabrication technique used to create the circuit pattern 110. For example, 2 to 3 micron circuit pattern 110 have been in uses for years. More recently, 1 micron and sub-micron circuit pattern 110 have become more common. The dies 102 are separated from each other with scribelines 104. Within each die 102 there can be resistless regions 106 where the resist has been fully removed. A residue defect 108 can occur anywhere on the wafer 100. Residue defects tend to occur in resistless areas such as resistless regions 106. The wafer 100 may be made of silicon dioxide, metal film, or polysilicon coated wafer.

Figure 2:
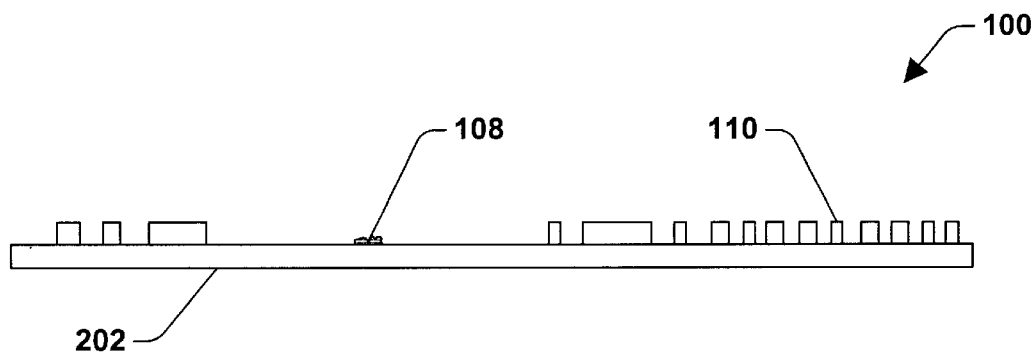
FIG. 2 is an illustration of a cross-sectional view of the wafer of FIG. 1.

FIG. 2 shows the wafer 100 of FIG. 1 is shown in cross-section after development of the resist material. The wafer 100 includes a substrate 202 and resist lines or circuit pattern 110. The wafer 100 may include residue defects 108. Such physical defects can affect the operability of the die 102. The residue defect 108 tends to adhere to a functional area of the die 102 where the photoresist is completely removed. A residue defect 108 in such an area is more prone to cause functional problems than if it had occurred elsewhere.

Figure 3:
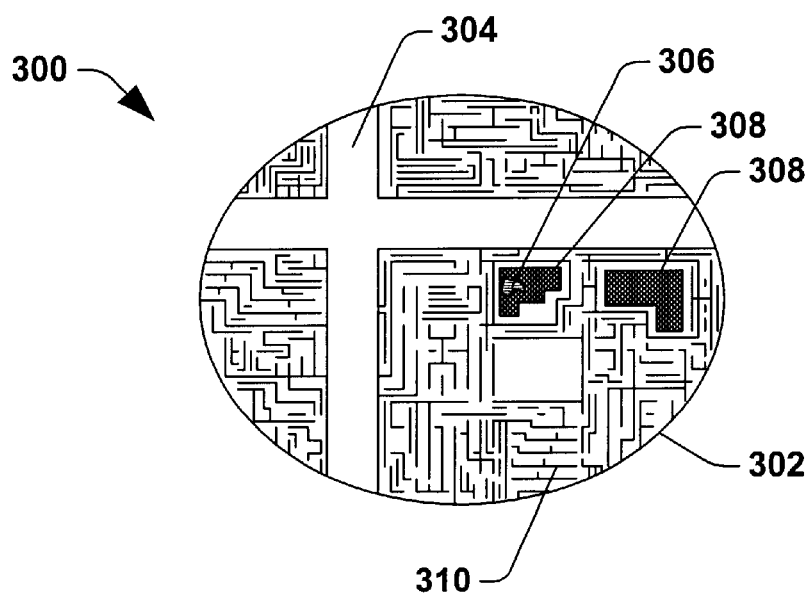
FIG. 3 is an illustration of a wafer with a plurality of dies with defect collecting structures in the dies.

FIG. 3 shows a wafer 300 containing numerous dies 302 that are separated from each other with scribelines 304. Within a die 302, there can be resist regions 308 and resist lines 310 where the resist has not been removed. Residue defect 306 may occur during the fabrication process.

Now, the resist region 308, also called defect collecting structures, can include a structure made of resist that is functional or non-functional. The defect collecting structure 308 tends to attract residue defects 306, thus preventing those residue defects 306 from adhering to other areas of the die 302. Such structures 308 can be located in areas of the die 302 that would otherwise have been fully developed as unused portions of the die 302. The dimensions of the defect collecting structure 308 should be sufficiently larger than the dimensions of the circuit patterns near the defect collecting structure 302 so that the defect is attracted to the defect collecting structure 308 and away from the circuit patterns. The defect collecting structure 308 can be as small as 10 and as large as 100, or more times the size of surrounding circuit patterns. The defect collecting structure 308 can be as small as 0.01% of the die 302 surface area or larger. A larger defect collecting structure 308 can be more effective at collecting defects 306. A plurality of defect collecting structures 308 can be used on a single die. The defect collecting structures 308 can be contiguous or noncontiguous. The defect collecting structure 308 should be of a substantially regular shape such as a rectangle, a circle, or a trapezoid. The defect collecting structure 308 can be a part of the functional circuit pattern of the die 302 or can be non-functional as a circuit component. The defect collecting structures 308 can be placed in the die 302 such that each defect collecting structures 308 attracts defects near it, protecting the circuit patterns on the entire die 302 from defects.

It is preferred that the pattern dimension of the defect collecting structure 308 be four times greater then the pattern dimension of the circuit pattern 310. For example, if the circuit pattern 310 is a 1 micron design, then the defect collecting structure 308 should be at least 4 microns in width and length.

Figure 4:
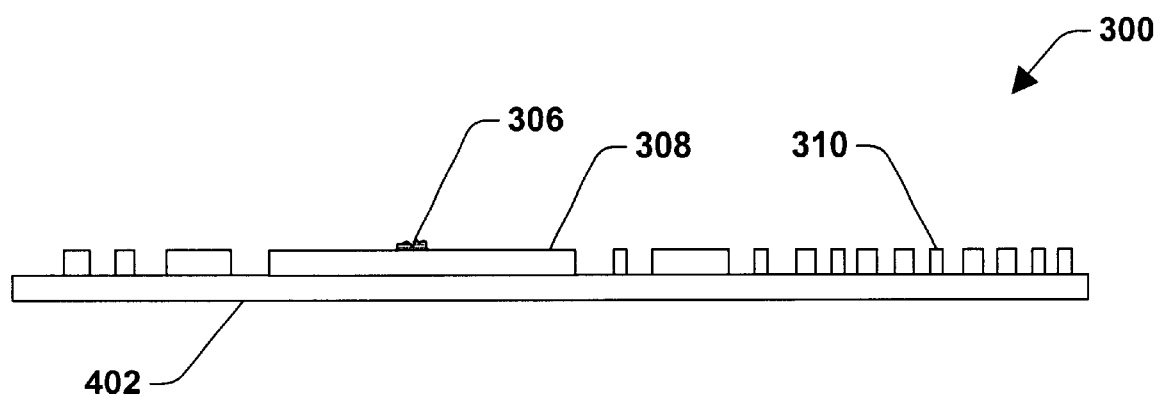
FIG. 4 is an illustration of a cross-sectional view of the wafer of FIG. 3.

Referring to FIG. 4, a section of the wafer 300 of FIG. 3 is shown in cross-section. The wafer 300 of FIG. 3 includes a substrate 402, resist lines 310, and a defect collecting structure 308. The wafer 300 may include residue defects 306. Such physical defects can affect the operability of the die 302.

Figure 5:
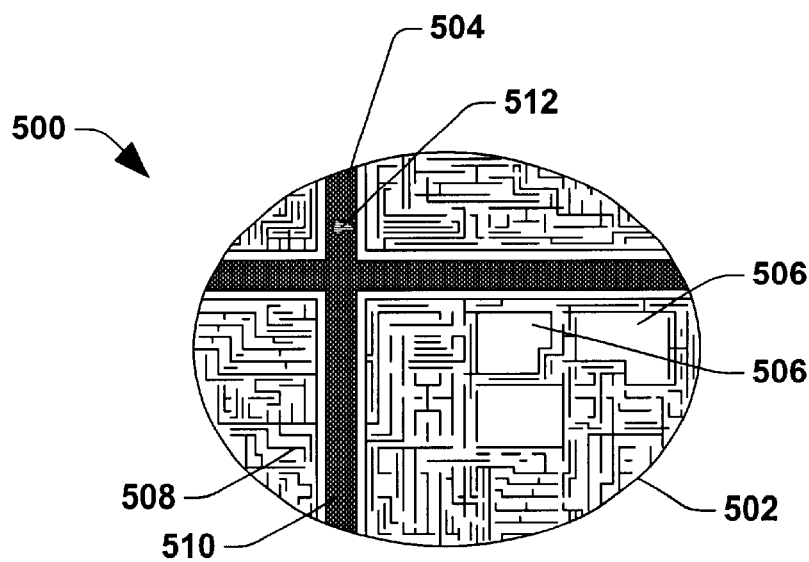
FIG. 5 is an illustration of a wafer with a plurality of dies with defect collecting structure on the scribelines.

Referring to FIG. 5, a wafer 500 containing numerous dies 502 that are separated from each other with scribelines 504. The defect collecting structure 510 can be located in the scribelines 504, thus not interfering with the development of the die 502. The defect collecting structure 510 attract residue defects 512 away from the dies 502.

Figure 6:
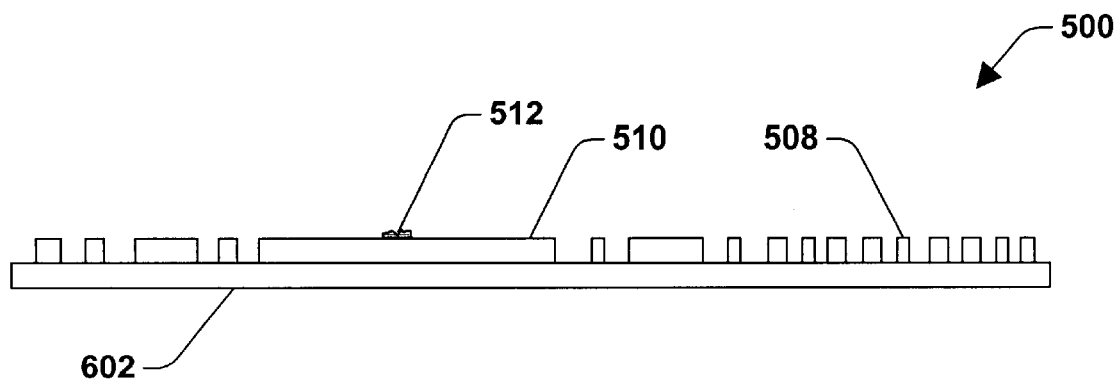
FIG. 6 is an illustration of a cross-sectional view of the wafer of FIG. 5.

Referring to FIG. 6, the wafer 500 of FIG. 5 is shown in cross-section. The wafer 500 of FIG. 6 includes a substrate 602, resist lines 508, and defect collecting structures 510. The wafer 500 may include residue defect(s) 512. The defect collecting structure 510 is in a scribeline 504 and the residue defect 512 is on the defect collecting structure 510.

While preferred embodiments have been shown and described, it will be understood that they are not intended to limit the disclosure, but rather it is intended to cover all modifications and alternative methods and apparatuses falling within the spirit and scope of the invention as defined in the appended claims or their equivalents.

What is claimed is:

1. A semiconductor wafer comprising:
   (a) a substrate; and
   (b) a plurality of identical dies formed on the substrate, each die containing first and second non-overlapping areas,
   the first area including a functional circuit pattern having a first pattern dimension;
   the second area including a defect collecting structure having a second pattern dimension at least four times the first dimension.

2. The wafer of claim 1 wherein the defect collecting structure is non-functional.

3. The wafer of claim 1 wherein the defect collecting structure is functional.

4. The wafer of claim 1 wherein the defect collecting structure is a regularly shaped, contiguous structure.

5. The wafer of claim 1 wherein the defect collecting structure includes undeveloped resist material.

6. The wafer of claim 1 wherein the second area includes a plurality of non-contiguous regions, each non-contiguous region including a defect collecting structure.

7. The wafer of claim 6 wherein the second area occupies at least one hundredth of one percent of the die surface area.

8. A semiconductor wafer comprising:
   (a) a substrate; and
   (b) a plurality of dies formed on the substrate;
   (c) scribelines separating the dies;
   (d) a defect collecting structure attracting residue defects caused during development of photoresist, the defect collecting structure being located within the scribelines.

9. The wafer of claim 8 wherein the scribelines include a plurality of defect collecting structures.

10. The wafer of claim 9 wherein the defect collecting structures are non-contiguous.

11. The wafer of claim 8 wherein the defect collecting structures are non-functional.

12. The wafer of claim 8 wherein the defect collecting structures are a regularly shaped, contiguous structures.

13. The wafer of claim 8 wherein the defect collecting structures include undeveloped resist material.

* * * * *